United States Patent [19]

Monnier

[11] 3,968,360

[45] July 6, 1976

[54] HIGH RESOLUTION PHOTOCONDUCTIVE ARRAY AND PROCESS FOR FABRICATING SAME

[75] Inventor: Milton H. Monnier, Santa Barbara, Calif.

[73] Assignee: Hughes Aircraft Company, Culver City, Calif.

[22] Filed: Apr. 14, 1975

[21] Appl. No.: 567,982

[52] U.S. Cl. .............................. 250/211 R; 29/572; 250/212; 250/578; 338/17; 338/18
[51] Int. Cl.² ........................................ H01L 31/08
[58] Field of Search ............ 250/211 R, 211 J, 212, 250/208, 209, 578; 338/17, 18; 29/572

[56] References Cited
UNITED STATES PATENTS

| | | | |
|---|---|---|---|
| 2,884,508 | 4/1959 | Czipott et al. | 338/17 |
| 3,634,424 | 1/1972 | Golubovic | 250/212 X |

*Primary Examiner*—Eugene La Roche
*Attorney, Agent, or Firm*—William J. Bethurum; W. H. MacAllister

[57] ABSTRACT

Disclosed is a novel photoconductive array suitable for use as an infrared detector, and a novel process for fabricating same. In this process, a chosen metallization pattern is disposited on the surface of an insulating substrate, and thereafter the metallization pattern is either covered or partially covered with a layer of selected photoconductive material, such as lead selenide or lead sulfide. The photoconductive material is formed into a predetermined pattern which is accomplished using conventional photoetch techniques. Then, a suitable photoresist mask is deposited at a selected location on the surface of the photoconductive layer in preparation for an electroplating step. In this electroplating step, a surface contact metallization for the photoconductor is plated on both the previously deposited photoconductive and metal surfaces which are not masked by the photoresist. This electroplated contact metallization for the photoconductor exhibits excellent adherence to the somewhat rough surface of the photoconductive material, and the present process exhibits an improved geometry reduction capability relative to prior art processes.

8 Claims, 6 Drawing Figures

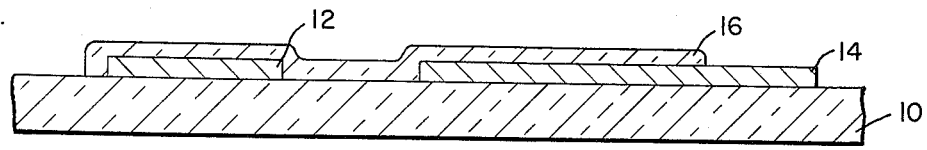
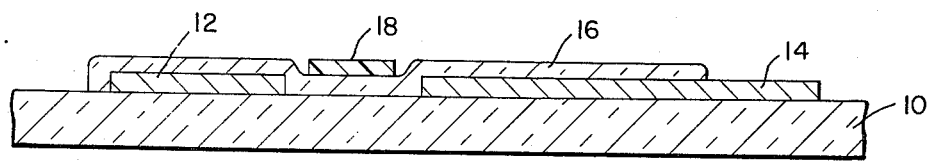
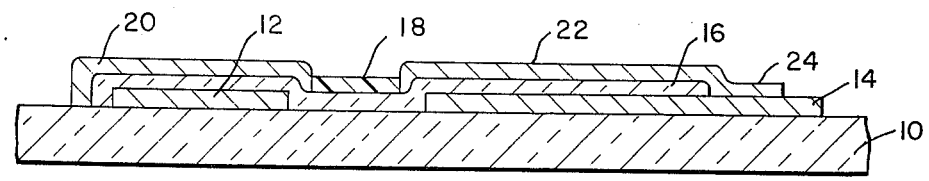
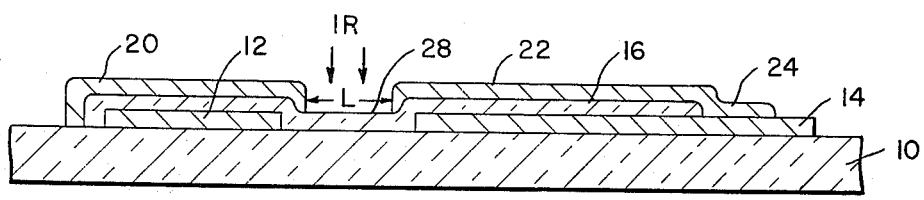
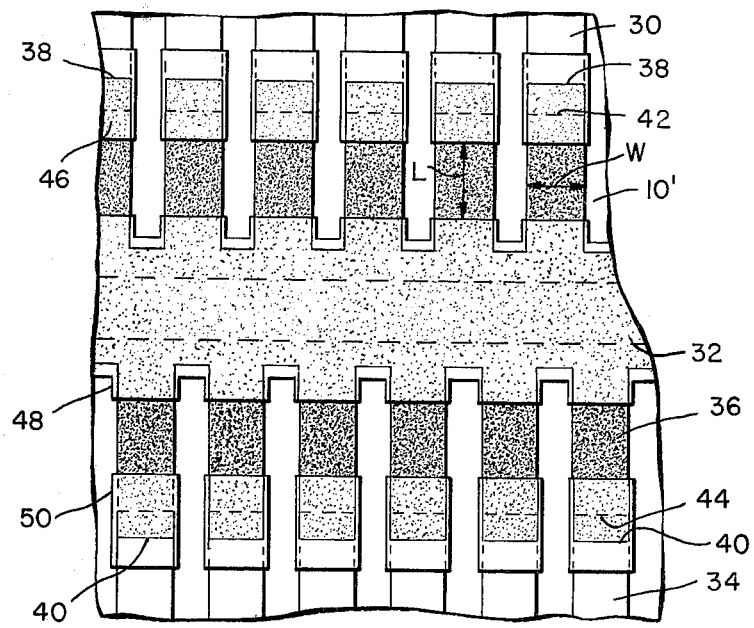

HIGH RESOLUTION PHOTOCONDUCTIVE ARRAY AND PROCESS FOR FABRICATING SAME

FIELD OF THE INVENTION

This invention relates generally to photoconductive infrared detector arrays and more particularly to a novel electroplating fabrication process for reducing the geometry of such arrays and improving the electrical contacts to the surface thereof.

BACKGROUND

The use of the lead salts, such as lead sulfide (PbS) and lead selenide (PbSe), as photoconductive materials for infrared detector arrays is well known in the art. These detector materials have been used in various array geometries for many years and conventionally they are deposited initially as a polycrystalline film on a suitable insulating substrate. State of the art processes use conventional photoresist masking and etching techniques to form an array of discrete lead sulfide or lead selenide islands on the surface of the substrate.

In order to improve the resolution of imaging devices using these arrays, it frequently becomes necessary to increase the number of discrete photoconductive elements per array, and this in turn requires a corresponding increase in the number of electrical contacts made on a particular array surface. Additionally, it has been established empirically that the best performance of these arrays is obtained when electrical contacts are made exclusively to the surfaces of the photoconductive detector elements of the array exposed to incoming radiation, i.e. the top surfaces.

PRIOR ART

Hitherto, it has been a standard practice in the art to make these top surface contacts to the discrete detector elements of an array by vacuum depositing a suitable conductive material, such as gold, through a metal stencil type mask. This mask is initially aligned with the previously formed detector array, whereafter the mask and array are transferred to a suitable vacuum deposition system for depositing gold through openings in the stencil type mask and into electrical contact with the individual detector elements of the array.

As the size of the individual detector elements is reduced, with an increasing number and density of elements per array, the fabrication of suitable stencil type metal masks for the above purpose has become increasingly difficult. Furthermore, as a result of the relatively rough surfaces of the lead salt islands to which surface electrical contact must be made, the metal which is vacuum deposited through the metal mask does not always form to and adhere satisfactorily to these lead salt detector elements.

THE INVENTION

The general purpose of the present invention is to provide an improved infrared detector fabrication process relative to the above described prior art process. My process possesses all of the significant advantages of the above prior art process, while having none of its aforedescribed disadvantages. Furthermore, my process features an improved geometry reduction capability relative to prior art processes. To attain this purpose, I have conceived and reduced to practice a novel film deposition and electroplating process for making good electrical contact to photoconductive elements in a detection array. This process initially involves forming a metallization pattern, such as a pattern of gold, on the surface of an insulating substrate. The gold may be underlaid with a thin layer of titanium or chromium to improve adhesion to the underlying substrate, as is well known in the art. Next, a thin film of photoconductive material is deposited and defined over the metallization pattern, whereafter a suitable mask, such as photoresist, is positioned at selected locations on the photoconductive film. Thereafter, the above structure is transferred to suitable electroplating bath wherein contact metallization is plated on the previously deposited and unmasked metal and photoconductive layers. Finally, the photoresist mask is removed from the top photoconductor surface to thereby define the edges of the electroplated metallization pattern and also one dimension of rectangular areas of photoconductive material which extend respectively between two adjacent electroplated contacts.

Accordingly, it is an object of the present invention to provide a new and improved process for fabricating photoconductive detector arrays.

Another object is to provide a fabrication process of the type described which is capable of reducing the spacing between photoconductive elements and contacts therefor beyond these corresponding dimensions of arrays produced by standard photoresist and vacuum contact deposition processes of the prior art.

Another object is to provide a fabrication process of the type described which requires a relatively small number of individual processing steps and one which is simple and easy to carry out.

A feature of this invention is the provision of a new and improved lead salt detector array wherein the surface metallization contacts to the lead salt elements are characterized by extremely good coverage and adherency.

Another feature of this invention is the provision of a film deposition and electroplating process combination of the type described which eliminates the need for a metal stencil-type vacuum deposition mask and its related problems.

These and other objects and features of the invention will become more readily apparent in the following description of the accompanying drawings.

DRAWING

FIGS. 1a through 1e illustrate, in schematic cross-section views, the sequence of individual processing steps utilized in a preferred process embodiment of the invention.

FIG. 2 illustrates, in plan view, the topographical spacing and geometry of the individual detector elements and contacts thereto forming a partial detector array according to the invention.

Referring now to FIG. 1a, there is shown a substrate starting material 10, which is an insulator such as sapphire ($Al_2O_3$), and this substrate is initially cleaned and polished using standard solid state processing techniques which are well known in the art. Next, the substrate 10 is transferred to a metal vacuum deposition station where a continuous layer (not shown) of titanium-gold is deposited over a wide surface area of the substrate 10 and then selectively photoetched using a partial electrode pattern so as to leave a plurality of surface islands or strips 12 and 14 as shown in FIG. 1b. Next, the substrate 10 with the metallization pattern 12, 14 as described is transferred to a lead salt deposition station where a thin film 16 of polycrystalline lead sulfide, PbS, is deposited as shown in FIG. 1b using standard thin film semiconductor deposition and definition techniques.

Next, the sub-structure in FIG. 1b is transferred to a suitable photoresist station where a photoresist mask 18 is deposited on the surface of the lead sulfide film 16. This mask 18 acts as a protective covering mask whose length L defines one dimension of a rectangular lead sulfide detector element (rectangular PbS surface area) being developed.

The sub-structure in FIG. 1c with the mask 18 intact is then transferred to an electroplating bath, and the metal regions 12 and 14 on the sapphire substrate 10 are connected to one electrode of the bath, so that electroplating current passes vertically through the exposed portions of the lead sulfide layer 16 which overlie the conductive islands 12 and 14. This electroplating current also flows both horizontally and vertically through the lead sulfide regions which do not have an underlying metallization layer so that gold is deposited on both the photoconductive PbS layer and metallization layer not masked by the photoresist mask 18. This process step plates out a surface layer of gold in the pattern 20, 22 as shown in FIG. 1d and abutting the edges of the previously formed photoresist mask 18. Thus, this process serves not only to plate gold adjacent the mask 18 for purposes of defining the length "L", but it also enables good electrical contact to be simultaneously made at metal regions 24 to thereby enhance the metal-interconnect flexibility for a given detector array.

The sub-structure in FIG. 1d is then transferred to a suitable soak solvent such as acetone to remove the photoresist mask 18, thereby leaving the completed detector array in FIG. 1e having a plurality of uncovered lead sulfide detector elements 28 to which electrical contacts 20 and 22 are firmly adhered and separated by a distance L as shown. In one such array which I have fabricated, the surface electrode pattern 20, 22 of gold was electroplated using a neutral plating solution of "Pure-a-gold 125" sold by the Sel-Rex Corporation of Nutley, New Jersey.

While the process illustrated in the drawing shows only a pair of contacts 20 and 22 to a single lead sulfide detector element 28, it will be understood and appreciated that a large plurality of photoconductive elements 28 and corresponding contacts 29 and 22 can be provided in a single array fabrication process. Thus, any desired masking geometry can be utilized with the above process in order to provide a required size and spacing for individual photoconductive elements of an array. That is, all of the masking and etching steps utilized to make all of the film materials shown in FIG. 1d may be varied in both size and spacing within the scope of the present invention.

Additionally, the present process is not limited to the photoresist masking of the PbS layer alone, and in some instances it may be desirable to apply a photoresist mask directly to certain surface areas of the basic surface metallization pattern 12, 14 in order to selectively prevent the subsequent metal electroplating thereon.

Referring now to FIG. 2, there is shown a partial plan view of a lead sulfide detector array of the type which I have successfully reduced to practice in accordance with the teachings of this invention. Specifically, FIG. 2 shows a surface metallization pattern 30, 32, 34 which is deposited and defined to the geometry shown on the surface of a sapphire substrate 10 previously described. An intermediate layer 36 of lead sulfide is deposited and defined between boundaries 38 and 40 as shown, so that this lead sulfide layer 36 completely covers the central conductor 32 of the bottom metallization pattern, and it also covers the inner edges of 42 and 44 of the metal strips 30 and 34. This lead sulfide is defined, typically by photoresist and etching techniques, thereby determining the width, W of the active photoconductive element 28.

Next, a photomask, such as photoresist is deposited on the surface of the lead sulfide layer and is defined to form a plurality of strips or rectangles having a dimension L which determines the length of the active photoconductive area. In the plan view of FIG. 2, there are twelve such areas formed which define the active detector areas of the twelve lead sulfide photoconductor elements.

The masked structure as defined above is then submerged in an electroplating bath as previously described with reference to FIG. 1, so that an upper metallization pattern 46, 48, 50 is electroplated both on the unmasked areas of the lead sulfide area and on the unmasked areas of the bottom metallization pattern 30. Thus, the lower conductive metallization strips 30 and 34 are electrically interconnected to the upper metallization strips 46 and 50 at the extreme edges thereof to thereby increase the metal electrical interconnect flexibility of the detector array.

It has been found in some applications that electroplating will take place on all unmasked conductive areas of the detector material and the metallization strips when the central common area (e.g. 32) only is connected to the electroplating power supply. This occurs because current flows through the detector material covered by photoresist to unmasked areas at all output leads. This is of practical importance since only a single electrical connection to the workpiece need be made, and it is thus not necessary to have all output lead areas joined by jumper wires or otherwise electrically connected individually to the plating power supply.

The process described and claimed herein is not specifically limited to the particular detector, substrate and masking materials disclosed, and may be used with many variations of each of these latter materials. In addition, the present process may obviously be used to produce detector arrays in a wide variety of detector geometries.

What is claimed is:
1. A photodetector array including photoresponsive elements defined by:
   a. a film of photoconductive material deposited on both an insulating substrate and on a metallization pattern thereon, and
   b. electroplated contacts overlying a portion of said photoconductive film atop metal regions in said pattern and separated a predetermined distance above a portion of said photoconductive film which is in direct contact with said substrate, and the spacing between said electroplated contacts defining one dimension of said photoresponsive elements.

2. The array defined in claim 1 wherein said electroplated contacts are also deposited on selected areas of said metallization pattern to provide electrical interconnect flexibility to said array.

3. The array defined in claim 2 wherein said photoconductive material is selected from the group consisting of lead sulfide (PbS) and lead selenide (PbSe).

4. A process for fabricating photoconductive detector arrays characterized by improved electrical contacts to individual detector elements therein, including in combination:
   a. providing a suitable insulating substrate for supporting said array,
   b. forming a selected conductive pattern on the surface of said substrate,
   c. depositing a patterned layer of radiation sensitive material atop said conductive pattern and on the substrate exposed thereby,
   d. masking a selected area of said radiation sensitive layer to prevent contact formation thereon,
   e. electroplating a selected metal on unmasked surface areas of said radiation sensitive layer, and
   f. removing the masking from said selected area of said radiation sensitive layer whereby good adhering electrical contact is made to individual detector elements of said array whose photoresponsive surface area dimensions are controlled by the dimensions of said mask.

5. The process defined in claim 4 wherein said radiation sensitive material is selected from the group consisting of lead sulfide (PbS) and lead selenide (PbSe).

6. The process defined in claim 4 wherein a single unmasked area is connected to a power supply to electroplate said selected metal on a plurality of unmasked areas separated by photoresist but joined electrically through conduction in said radiation sensitive material.

7. The process defined in claim 4 wherein said selected metal is also deposited directly on said selected conductive metal on said substrate to thereby increase the electrical-interconnect capability and flexibility of said arrays.

8. The process defined in claim 7 wherein said radiation sensitive material is selected from the group consisting of lead sulfide (PbS) and lead selenide (PbSe).

* * * * *